US 9,299,748 B2

(12) United States Patent
Schicktanz et al.

(10) Patent No.: US 9,299,748 B2
(45) Date of Patent: Mar. 29, 2016

(54) ORGANIC OPTOELECTRONIC COMPONENT

(71) Applicant: OSRAM OLED GmbH, Regensburg (DE)

(72) Inventors: Simon Schicktanz, Regensburg (DE); Erwin Lang, Regensburg (DE)

(73) Assignee: OSRAM OLED GmbH, Regensburg (DE)

( * ) Notice: Subject to any disclaimer, the term of this patent is extended or adjusted under 35 U.S.C. 154(b) by 0 days.

(21) Appl. No.: 14/648,888

(22) PCT Filed: Nov. 18, 2013

(86) PCT No.: PCT/EP2013/074071
§ 371 (c)(1),
(2) Date: Jun. 1, 2015

(87) PCT Pub. No.: WO2014/086575
PCT Pub. Date: Jun. 12, 2014

(65) Prior Publication Data
US 2015/0349027 A1  Dec. 3, 2015

(30) Foreign Application Priority Data

Dec. 6, 2012 (DE) .......................... 10 2012 222 461

(51) Int. Cl.
*H01L 27/30* (2006.01)
*H01L 27/32* (2006.01)
*H01L 27/28* (2006.01)

(52) U.S. Cl.
CPC ....... *H01L 27/288* (2013.01); *H01L 2251/5361* (2013.01); *H01L 2251/562* (2013.01)

(58) Field of Classification Search
CPC ..................................................... H01L 27/288
USPC ........................................................ 257/80, 98
See application file for complete search history.

(56) References Cited

U.S. PATENT DOCUMENTS

| | | | |
|---|---|---|---|
| 6,430,325 B1 * | 8/2002 | Shimoda | G02B 6/12004 257/E31.062 |
| 6,930,658 B2 | 8/2005 | Lee et al. | |
| 8,101,950 B2 | 1/2012 | Yamazaki et al. | |
| 8,310,413 B2 | 11/2012 | Fish et al. | |
| 2006/0132786 A1 * | 6/2006 | Helbing | A61B 5/14546 356/446 |
| 2007/0102654 A1 | 5/2007 | Schoo | |
| 2007/0194719 A1 | 8/2007 | Heuser et al. | |
| 2009/0134309 A1 | 5/2009 | Leo et al. | |

(Continued)

FOREIGN PATENT DOCUMENTS

| | | |
|---|---|---|
| EP | 1043780 A1 | 10/2000 |
| EP | 1672356 A1 | 6/2006 |

(Continued)

*Primary Examiner* — George Fourson, III
(74) *Attorney, Agent, or Firm* — Slater & Matsil, L.L.P.

(57) ABSTRACT

An organic optoelectronic component includes a substrate embodied in a light-transmissive fashion, an organic light-emitting element having an organic light-emitting layer between two electrodes, and an organic light-detecting element having an organic light-detecting layer. The organic light-emitting element and the organic light-detecting element are arranged on the substrate. Part of the light generated by the organic light-emitting element during operation enters into the substrate, emerges from the substrate and is detected by the organic light-detecting element.

19 Claims, 5 Drawing Sheets

(56) References Cited

U.S. PATENT DOCUMENTS

| | | |
|---|---|---|
| 2011/0284721 A1 | 11/2011 | Iwabuchi et al. |
| 2013/0163928 A1* | 6/2013 | Wang .................. G02B 6/1221 385/37 |
| 2015/0243710 A1* | 8/2015 | Popp ..................... H01L 51/448 315/158 |
| 2015/0270313 A1* | 9/2015 | Popp ................... H01L 27/3269 315/152 |
| 2015/0333106 A1* | 11/2015 | Popp ..................... H01L 27/288 315/151 |
| 2015/0340409 A1* | 11/2015 | Popp ..................... H01L 27/288 315/150 |

FOREIGN PATENT DOCUMENTS

| | | |
|---|---|---|
| EP | 2065698 A1 | 6/2009 |
| JP | 200544732 A | 2/2005 |

\* cited by examiner

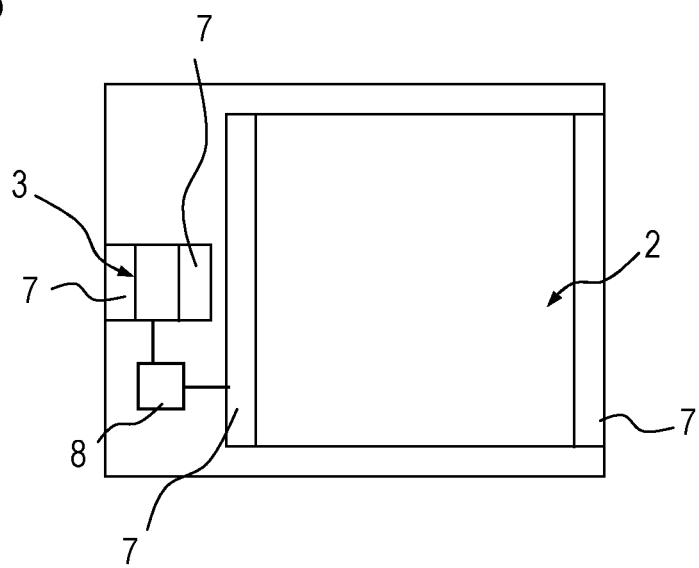

ORGANIC OPTOELECTRONIC COMPONENT

This patent application is a national phase filing under section 371 of PCT/EP2013/074071, filed Nov. 18, 2013, which claims the priority of German patent application 10 2012 222 461.0, filed Dec. 6, 2012, each of which is incorporated herein by reference in its entirety.

TECHNICAL FIELD

An organic optoelectronic component is specified.

BACKGROUND

The document US 2007/0194719 A1 describes an organic optoelectronic component.

SUMMARY

Embodiments of the invention specify an organic optoelectronic component wherein the intensity and/or the color locus of the emitted light can be kept as constant as possible over the entire lifetime of the component.

In accordance with at least one embodiment of the organic optoelectronic component, the organic optoelectronic component comprises a substrate. The substrate is the carrying element of the component, on which further component parts of the component are arranged. The substrate is embodied as a rigid body or as a film, which can also be flexible. The substrate comprises two opposite main surfaces connected to one another by side surfaces of the substrate. The substrate can be embodied in a cuboic fashion, for example.

The substrate is formed with a radiation-transmissive material, for example. In this case, it is possible for the substrate to be embodied as pellucid and transparent or milky and translucent. That is to say that the substrate is preferably embodied as light-transmissive, wherein it is embodied in particular as transmissive to visible light. Here and hereinafter, "light-transmissive" means that, at least for part of the spectrum of visible light, at least 80% of the light entering the substrate at a main surface and radiating through the substrate leaves the substrate at an opposite main surface.

The substrate can, for example, be formed with a plastic or with a glass or consist of one of these materials.

In accordance with at least one embodiment of the organic optoelectronic component, the component comprises an organic light emitting element. The organic light emitting element forms an organic light emitting diode (OLED), for example. The organic light emitting element comprises at least one organic light emitting layer arranged between at least two electrodes, for example, an anode and a cathode. In this case, the electrodes of the organic light emitting element can be embodied as light-transmissive or light-reflecting. In particular, it is possible for both electrodes to be embodied as light-transmissive or for one electrode to be embodied as light-transmissive and the other electrode to be embodied as light-reflecting. Here and hereinafter, "light-reflecting" means that at least 80% of the light impinging on the reflective element is reflected.

In accordance with at least one embodiment of the organic optoelectronic component, the organic optoelectronic component comprises an organic light detecting element. The organic light detecting element can be an organic photodiode, for example. The organic light detecting element comprises at least one organic light detecting layer which can be arranged between two electrodes. In this case, it is possible, in particular, for the organic light emitting element and the organic light detecting element to have the same layer construction, with the difference that anode and cathode in the organic light detecting element are interchanged relative to anode and cathode in the organic light emitting element. Furthermore, it is possible for the organic light detecting element to have at least one organic light detecting layer, which differs from the organic light emitting layers of the organic light emitting element with regard to composition and/or thickness.

In accordance with at least one embodiment of the organic optoelectronic component, the organic light emitting element and the organic light detecting element are arranged on the substrate. In this case, it is possible for the two elements to be arranged on identical or different main surfaces of the substrate. The two elements can be produced in particular by the same production techniques, for example, by means of vapor deposition, on the substrate.

In accordance with at least one embodiment of the organic optoelectronic component, part of the light generated by the organic light emitting element during operation enters the substrate, subsequently emerges from the substrate and is detected by the light detecting element. That is to say that the organic light detecting element is designed, in particular, to receive light generated by the organic light emitting element during operation. The light firstly passes through at least part of the substrate and from there passes into the detecting element.

In accordance with at least one embodiment of the organic optoelectronic component, the organic optoelectronic component comprises a substrate embodied in a light-transmissive fashion, an organic light emitting element having an organic light emitting layer between two electrodes, and an organic light detecting element having an organic light detecting layer. In this case, the organic light emitting element and the organic light detecting element are arranged on the substrate, and part of the light generated by the organic light emitting element during operation enters the substrate, emerges from the substrate and is detected by the organic light detecting element.

In this case, for example, one electrode for the connection of the organic light detecting element, which electrode faces the substrate, is embodied as light-transmissive. At least part of the light to be detected can then pass through the electrode before it is detected. The other electrode for the connection of the organic light detecting element, which electrode faces away from the substrate, can then be embodied as reflective, in particular. This electrode can keep light to be detected in the light detecting element and prevent light from outside from entering the light detecting element.

An organic optoelectronic component described here is based in this case on the following considerations, inter alia: in the case of a monochromatic or a polychromatic organic light emitting diode, in particular one that generates white light, there is often the requirement that the brightness and/or the color locus of the emitted light be kept as constant as possible over the lifetime. For this purpose, it proves to be advantageous if the brightness and/or the color locus of the light are/is measured during operation and a current with which the organic optoelectronic component is operated is readjusted in such a way that the brightness and/or the color locus remain(s) substantially constant.

In the case of the organic optoelectronic component described here, the brightness sensor and/or the color sensor are/is embodied as organic photodiode, for example, which is integrated on the same substrate as the light emitting element. By way of example, the organic light detecting element, in the same way as the organic light emitting element, can be applied to the substrate by a vapor deposition method. In this case, the organic light detecting element, that is to say the photodiode, for example, comprises organic light detecting layers which are sensitive in a predefinable, ideally broadband, spectral range of visible light or spectral range of visible light that is similar to the human eye sensitivity curve.

In the case of the organic optoelectronic component described here, that portion of the light generated by the emitting element which is to be detected by the organic light detecting element is guided through the substrate to the detecting element. This direct light guiding in the substrate enables the influence of extraneous light, for example, of ambient light, to be reduced to a minimum, such that no further measures are necessary for preventing extraneous light from impinging on the detecting element. It can then be assumed that the detecting element predominantly receives light from the organic light emitting element and the light emitting element can be correspondingly regulated in a manner dependent on signals of the detecting element.

In accordance with at least one embodiment of the organic optoelectronic component, the organic light emitting element and the organic light detecting element are arranged on the same main surface of the substrate. In this case, the two elements are arranged in a manner spaced apart from one another in a lateral direction. In this case, the lateral directions are those directions which run parallel to the main extension directions and the main surfaces of the substrate. That is to say that the organic light emitting element and the organic light detecting element can be arranged, for example, alongside one another on the same main surface of the substrate. In this case, it is possible for part of the light generated by the organic light emitting element during operation to be guided by the substrate to the organic light detecting element. The light from the light emitting element enters the substrate, for example, at a first main surface of the substrate and is scattered or subjected to total internal reflection at the opposite second main surface of the substrate. In this way, the light can be guided to the light detecting element if appropriate by repeated scattering or reflection at the main surfaces. Light emerging in the region of the light emitting element is then received by the light detecting element.

In this case, it is possible that the main surfaces of the substrate at which light is scattered and/or reflected in order to guide the light toward the light detecting element are embodied accordingly. In this regard, it is possible that a light scattering region, for example, in the form of a light scattering layer or film, is embodied at the main surface of the substrate facing away from the organic light emitting element, the region supporting light scattering. Furthermore, it is possible that, for example, metallic connection layers for contacting the light emitting element and/or the light detecting element are likewise utilized for reflecting light in the direction of the light detecting element.

By way of example, it is possible for the light emitting element and the light detecting element to be arranged in a manner laterally spaced apart from one another at a first main surface of the substrate. A contact layer provided for connecting the light detecting element and/or the light emitting element can be arranged onto the first main surface in the region between the light detecting element and the light emitting element. Light that is guided by the substrate to the organic light detecting element can be reflected at the contact layer, which is embodied in a metallic fashion, in particular, as a result of which the light guidance is supported. That is to say that, in accordance with at least one embodiment of the organic optoelectronic component, the organic light emitting element and the organic light detecting element are arranged on the same main surface of the substrate in a manner laterally spaced apart from one another. In this case, a contact layer for electrically contacting at least one of the two elements is arranged at least in places at the main surface at which the two elements are arranged, in the region between the organic light emitting element and the organic light detecting element. Part of the light generated by the organic light emitting element during operation is reflected at the contact layer in the direction of the main surface of the substrate situated opposite the organic light emitting element.

In accordance with at least one embodiment of the organic optoelectronic component, the organic light emitting element and the organic detecting element are arranged on mutually opposite main surfaces of the substrate. That is to say that the organic light emitting element is arranged, for example, at a first main surface of the substrate and the organic light detecting element is arranged at the opposite second main surface of the substrate. In this case, the two elements can be arranged in a manner spaced apart or offset with respect to one another in a lateral direction, such that the organic light detecting element does not lie in the main emission region of the light emitting element, but rather, for example, in an edge region of the emission region. Light generated by the organic light emitting element during operation can then emerge without deflection by reflection at the second main surface and can impinge directly on the organic light detecting element. Although such a component is more complex to produce than a component in which both elements are arranged on the same main surface, no further measures need be taken to direct the light from the light emitting element to the light detecting element.

In accordance with at least one embodiment of the organic optoelectronic component, the organic light emitting element emits mixed light having at least two color portions and/or colored light during operation. The mixed light can be white light, in particular. The organic light emitting element in this case can be a multicolor light emitting diode, which can comprise, for example, a plurality of mutually separately drivable pixels, strips or other regions. Furthermore, it is possible for the multicolor light emitting diode to contain organic light emitting layers which are arranged vertically one above another and in which light of different colors is emitted, which can, for example, likewise be mixed to form white light.

In this case, the organic light detecting element is designed to detect the light generated by the organic light emitting element during operation in a color-resolved fashion. That is to say that the organic light detecting element can determine the magnitude of the intensity of the individual color portions of the light or mixed light generated by the organic light emitting element during operation. By way of example, the organic light detecting element in this case is a photodetector that is sensitive in a plurality of spectral ranges that are different in terms of color. By way of example, the color detector can detect the colors red, blue and green separately from one another, wherein the organic light emitting light can emit mixed light having red, blue and green color portions or red, blue and green light during operation.

In accordance with at least one embodiment of the organic optoelectronic component, the organic light detecting element comprises at least two regions designed to detect light of different colors. The regions can be formed, for example, by virtue of the organic light detecting element having vertically or laterally structured organic light detecting layers consisting of different organic materials that are sensitive only in a specific, restricted spectral range, for example, the spectral range of red, green or of blue light. Furthermore, it is possible for at least one of the regions to comprise a color filter arranged between the substrate and the organic light detecting layer. In this case, the organic light detecting layers structured in a lateral direction, for example, are formed in each case with an organic material that is sensitive in a wide spectral range, for example, in the entire visible spectral range, and a color filter is disposed upstream of each of the regions in the direction of incidence, and only light of a specific color that is coupled in by the substrate is allowed to pass by the color filter.

In accordance with at least one embodiment of the organic optoelectronic component, the component comprises a drive device, which is electrically conductively connected to the organic light emitting element and the organic light detecting element, wherein the drive device is provided for controlling and/or regulating the organic light emitting element in a manner dependent on signals originating from the organic light detecting element. By way of example, the drive device can increase the current with which the organic light emitting element is operated if a drop in the brightness of the emitted light is ascertained by the organic light detecting element.

In this case, the drive device can likewise be arranged on the substrate. Furthermore, it is possible for the drive device to be realized by means of an organic electronic assembly which is likewise formed by vapor deposition of organic materials on the substrate together with the light detecting element and the light emitting element. It is also possible for the light detecting element, the light emitting element and the drive device to be jointly encapsulated against moisture and atmospheric gases. In this regard, by way of example, the layer of a thin-film encapsulation can extend over all the component parts of the organic optoelectronic component and jointly encapsulate them. It is also possible for the component parts to be covered by a common covering body that can serve as mechanical protection, for example, as anti-scratch protection in particular for the thin-film encapsulation.

BRIEF DESCRIPTION OF THE DRAWINGS

The organic optoelectronic component described here is explained in greater detail below on the basis of exemplary embodiments and the associated figures.

FIGS. 1A, 1B, 2A, 2B, 3A, 3B, 4A, 4B and 5 show exemplary embodiments of organic optoelectronic components described here in schematic illustrations.

Elements that are identical, of identical type or act identically are provided with the same reference signs in the figures. The figures and the size relationships of the elements illustrated in the figures among one another should not be regarded as to scale. Rather, individual elements may be illustrated with exaggerated size in order to enable better illustration and/or in order to afford a better understanding.

DETAILED DESCRIPTION OF ILLUSTRATIVE EMBODIMENTS

Figure 1A:
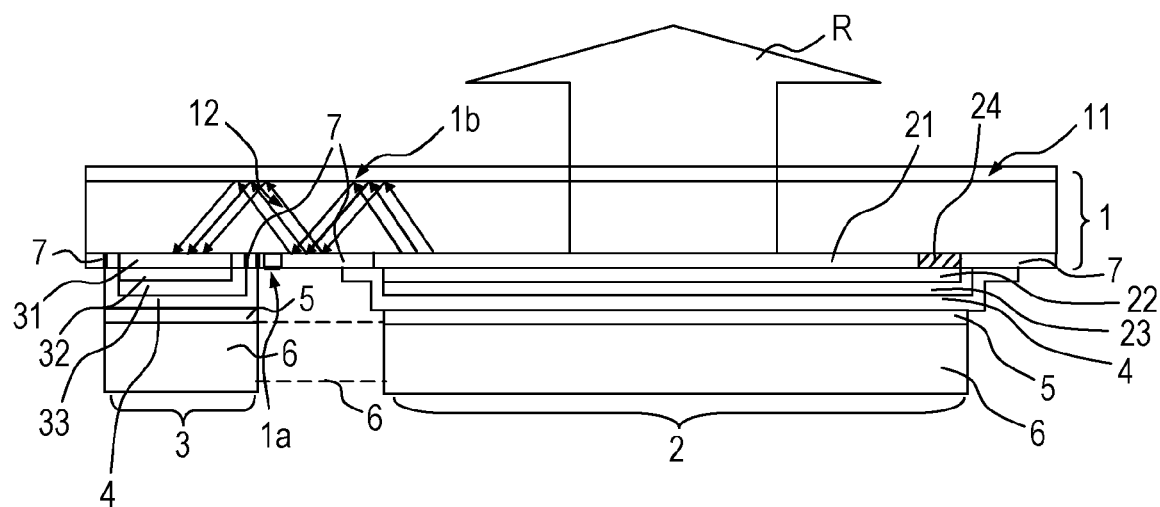

FIG. 1A shows a schematic sectional illustration of an organic optoelectronic component described here in accordance with a first exemplary embodiment. The organic optoelectronic component comprises a light-transmissive substrate 1. The light-transmissive substrate 1 comprises a first main surface 1a and a second main surface 1b. There is embodied at the second main surface 1b a light scattering region 11, for example, in the form of a scattering film, a scattering layer, a roughening of the substrate at the surface and/or in the form of scattering centers in the substrate, the region being optional. Furthermore, it is optionally, alternatively or additionally possible for a different light scattering region (not illustrated) to be embodied in the same way at the first main surface 1a of the substrate. An organic light emitting element 2 and an organic light detecting element 3 are arranged on the first main surface 1a of the substrate 1. That is to say that an organic light emitting diode, the organic light emitting element 2, and an organic photodiode, the organic light detecting element 3, are applied on the same side of the substrate 1.

The organic light emitting element 2 comprises a first electrode 21, for example, an anode, at least one organic light emitting layer 22 and a second electrode 23, for example, a cathode. At least one of the electrodes is embodied as light-transmissive. In this case, it is possible for both electrodes to be embodied as light-transmissive. Furthermore, one of the electrodes can be embodied as light-transmissive and the other electrode as light-reflecting.

The organic light emitting element 2 is covered at its exposed outer surfaces by an encapsulation layer sequence 4 comprising at least one encapsulation layer. By way of example, the encapsulation layer sequence 4 is a thin-film encapsulation which can be formed, for example, by means of PE-CVD (plasma-enhanced chemical vapor deposition) and/or an ALD method (atomic layer deposition) such as, for example, flash ALD, photo-induced ALD, and/or physical vapor deposition.

A connecting means 5 and a covering body 6 can be arranged at that side of the encapsulation layer sequence 4 which faces away from the substrate 1. The connecting means 5 can be a lamination adhesive, for example. The covering body 6 is then a laminated film, a glass or some other anti-scratch protection that mechanically protects the encapsulation layer sequence 4 and the other layers of the organic light emitting element.

The organic light detecting element 3 likewise comprises a first electrode 31, for example, a cathode, an organic light detecting layer 32 or a plurality of organic light detecting layers, and a second electrode 33, for example, an anode.

The organic light detecting element 3 is also encapsulated by the encapsulation layer sequence 4. In this case, the encapsulation layer sequence 4 which covers the organic light detecting element 3 can be identical with the encapsulation layer sequence 4 which covers the organic light emitting element 2. Furthermore, it is possible for the organic light detecting element 3 also to be covered by a covering body 6 connected to the encapsulation layer sequence 4 by means of a connecting means 5. In this case, it is also possible for a common covering body 6 to cover both the organic light emitting element 2 and the organic light detecting element 3.

The organic light emitting element 2 and the organic light detecting element 3 can be electrically connected via contact layers 7, wherein an insulating layer 24 can be arranged between the contact layer 7 and one of the electrodes. These contact layers 7 are also arranged in the region on the first main surface 1a between the emitting element 2 and the detecting element 3. The contact layers 7 can be formed with a metallic material which has good reflectivity and which supports guidance of light 12 in the substrate from the light emitting element 2 toward the light detecting element 3. Waveguiding of the light 12 is effected through the substrate 1, such that the detecting element detects part of the light 12 generated in the emitting element 2 during operation.

By means of a drive device 8 (in this respect, compare FIG. 5), which is electrically conductively connected both to the emitting element 2 and to the detecting element 3, the light emitting element 2 can be controlled and/or regulated with regard to the signals supplied by the detecting element 3 depending on the light 12. In this case, as shown in FIG. 5, the drive device 8 can likewise be fixed to one of the main surfaces 1a, 1b of the substrate 1. Furthermore, it is possible for the drive device 8 to be arranged at a distance from the substrate 1. The drive device 8 can be, for example, part of a device comprising one or a plurality of substrates on which light emitting and light detecting elements are in each case arranged.

As is shown in FIG. 1A, light can be guided by scattering and/or reflection at the main surfaces 1a, 1b of the substrate from the light emitting element 2 to the light detecting element 3. The scatterings and/or reflections can be supported by the light scattering region 11 at the second main surface 1b and the contact layers 7 at the first main surface 1a.

Figure 1B:
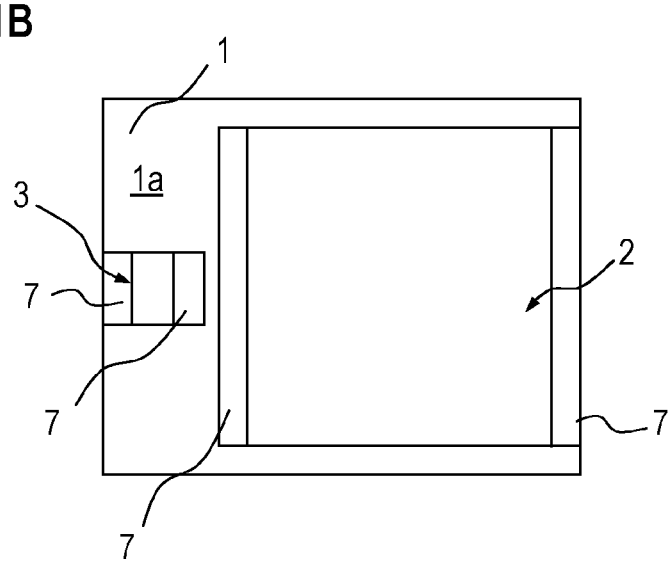

The schematic plan view in FIG. 1B shows a view of the first main surface 1a, at which the light detecting element 3 and the light emitting element 2 are arranged.

Figure 2A:
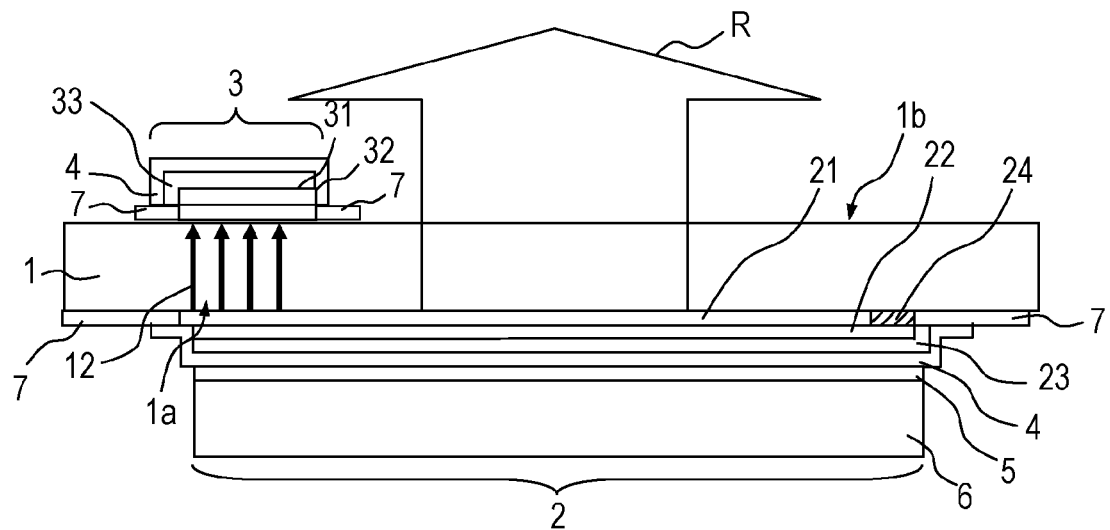

A further exemplary embodiment of an organic optoelectronic component described here is explained in greater detail in association with the schematic sectional illustration in FIG. 2A. In this exemplary embodiment, the light emitting element 2 and the light detecting element 3 are arranged at mutually opposite main surfaces 1a, 1b of the substrate 1. This embodiment is particularly well suited to substrates which are not pellucid and not transparent, but rather milky, translucent and which can be formed, for example, from a plastic material such as FR4.

The light detecting element 3 is provided for detecting the brightness of the light generated by the light emitting element 2 during operation. In this case, the light detecting element 3 is arranged in a manner spaced apart from a main emission region R of the light emitting element 2, such that light 12 generated in an edge region of the light emitting element 2 passes directly through the substrate 1 from the light emitting light to the light detecting element 3.

Figure 2B:
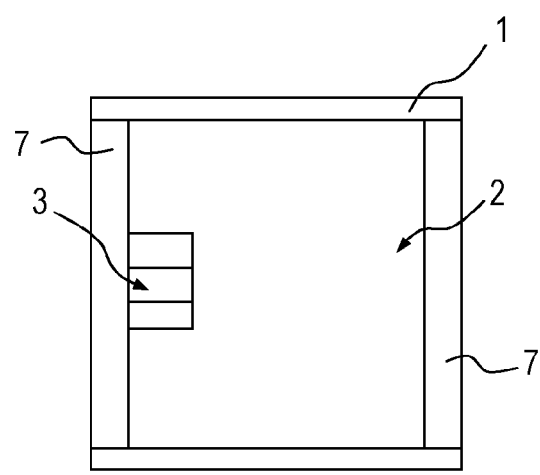

FIG. 2B shows the associated schematic plan view of the second main surface 1b of an organic optoelectronic component from FIG. 2A.

Figure 3A:
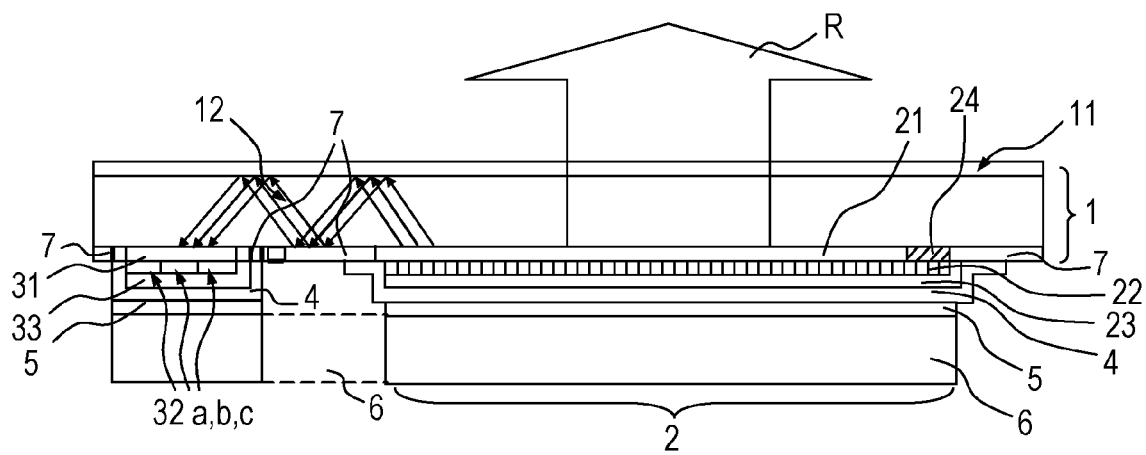
Figure 3B:
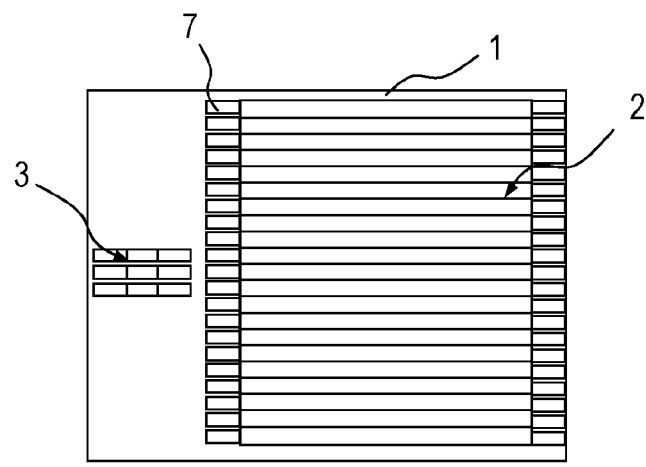

A further exemplary embodiment of an organic optoelectronic component described here is explained in greater detail in association with the schematic sectional illustration in FIG. 3. In contrast to the exemplary embodiments in FIGS. 1 and 2, the light emitting element 2 of the exemplary embodiment in FIG. 3 is a three-color light emitting diode in which light emitting layers 22 are arranged in strip form alongside one another, wherein the light emitting layers are designed alternately to generate red, green or blue light. The light detecting element 3 comprises three regions 32a, 32b, 32c arranged laterally adjacent to one another and each having an adapted acceptance spectrum. For example, one of the regions is designed to detect blue light, one of the regions is designed to detect red light, and one of the regions is designed to detect green light. The light detecting element 3 is arranged on the same side of the substrate as the light emitting element 2 and the light 12 is once again guided through the substrate by waveguiding. The light scattering region 11 can also contribute to the color mixing of the light generated by the light emitting element 2 during operation.

The regions 32a, 32b and 32c can be formed by organic light detecting layers arranged laterally adjacent to one another.

Figure 4A:
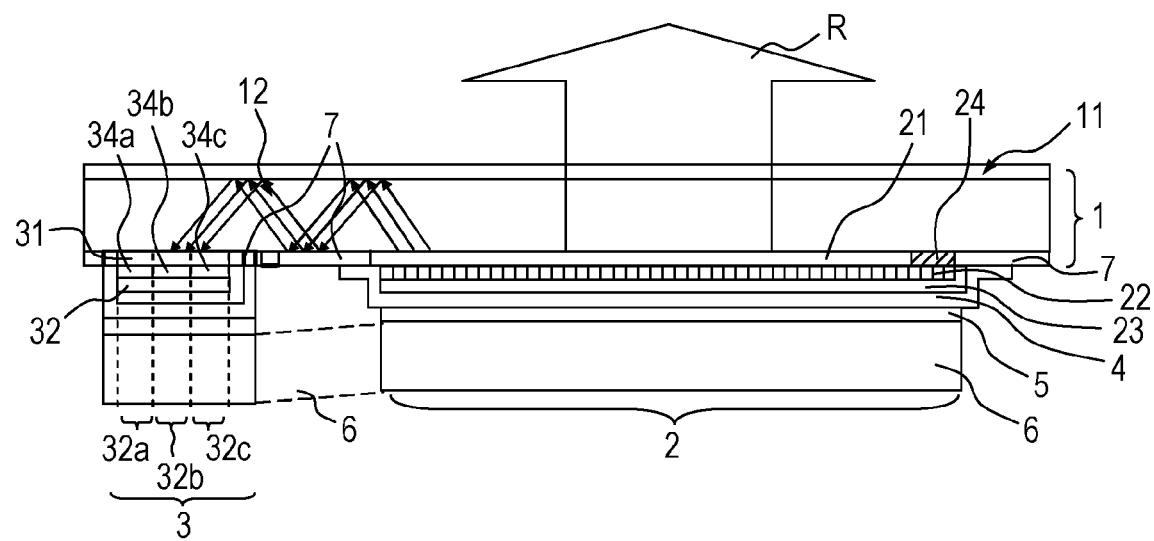
Figure 4B:
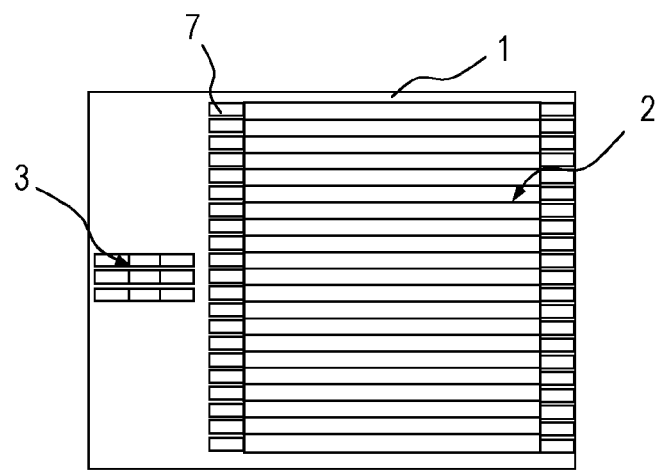

In contrast thereto, as described in association with FIGS. 4A and 4B, the light detecting element 3 can also comprise a light detecting layer 32 having a large acceptance range, for example, over the entire visible spectrum, wherein the regions 32a, 32b, 32c are formed by corresponding color filters 34a, 34b, 34c arranged between the substrate 1 and the organic light detecting layer 32.

The constructions described by way of example in association with FIGS. 3A, 3B, 4A, 4B make it possible to provide a component wherein not only is it possible for the brightness of the light generated by the light emitting elements 2 during operation to be determined by the light detecting element 3, but also it is possible to carry out a measurement and subsequent regulation of the color locus of the light.

The invention is not restricted to the exemplary embodiments by the description on the basis of the exemplary embodiments. Rather, the invention encompasses any novel feature and also any combination of features, which in particular includes any combination of features in the patent claims, even if this feature or this combination itself is not explicitly specified in the patent claims or exemplary embodiments.

The invention claimed is:

1. An organic optoelectronic component comprising:
   a substrate comprising a light-transmissive material;
   an organic light emitting element having an organic light emitting layer between two electrodes, the organic light emitting element configured to generate light during operation;
   an organic light detecting element having an organic light detecting layer;
   wherein the organic light emitting element and the organic light detecting element are arranged on the substrate; and
   wherein part of the light generated by the organic light emitting element during operation enters the substrate, emerges from the substrate and is detected by the organic light detecting element.

2. The organic optoelectronic component according to claim 1, wherein the substrate is embodied in a light-transmissive fashion.

3. The organic optoelectronic component according to claim 1, wherein the organic light emitting element and the organic light detecting element are arranged on the same main surface of the substrate and are laterally spaced apart from one another.

4. The organic optoelectronic component according to claim 3, wherein part of the light generated by the organic light emitting element during operation is guided by the substrate to the organic light detecting element.

5. The organic optoelectronic component according to claim 1, further comprising a light scattering region that is embodied at a main surface of the substrate facing away from the organic light emitting element.

6. The organic optoelectronic component according to claim 1, further comprising a light scattering region that is embodied at a main surface of the substrate facing the light emitting element.

7. The organic optoelectronic component according to claim 1, wherein the organic light emitting element and the organic light detecting element are both arranged on a main surface of the substrate and are laterally spaced apart from one another;
   wherein a contact layer for electrically contacting at least one of the organic light emitting element and the organic light detecting element is arranged at least in places at the main surface;
   wherein the contact layer is arranged in a region between the organic light emitting element and the organic light detecting element; and
   wherein part of the light generated by the organic light emitting element during operation is reflected at the contact layer in the direction of the main surface of the substrate located opposite the organic light emitting element.

8. The organic optoelectronic component according to claim 1, wherein the organic light emitting element and the organic light detecting element are arranged on mutually opposite main surfaces of the substrate.

9. The organic optoelectronic component according to claim 1, wherein
the organic light emitting element emits mixed light having at least two color portions and/or colored light during operation; and
the organic light detecting element is configured to detect the light generated by the organic light emitting element during operation in a color-resolved fashion.

10. The organic optoelectronic component according to claim 9, wherein the organic light detecting element comprises a plurality of regions configured to detect light of different colors.

11. The organic optoelectronic component according to claim 10, wherein at least one of the regions comprises a color filter arranged between the substrate and the organic light detecting layer.

12. The organic optoelectronic component according to claim 9, wherein the organic light emitting element is a three-color light emitting diode and has light emitting layers arranged in strip form alongside one another, wherein the light emitting layers are alternately designed to generate red, green or blue light.

13. The organic optoelectronic component according to claim 12, wherein the light detecting element comprises three regions arranged laterally adjacent to one another and each having an adapted acceptance spectrum.

14. The organic optoelectronic component according to claim 1, further comprising a drive device electrically conductively connected to the organic light emitting element and the organic light detecting element, wherein the drive device is provided for controlling and/or regulating the organic light emitting element in a manner dependent on signals originating from the organic light detecting element.

15. The organic optoelectronic component according to claim 14, wherein the drive device is arranged on the substrate.

16. An organic optoelectronic component comprising:
a substrate comprising a light-transmissive material;
an organic light emitting element having an organic light emitting layer between two electrodes, the organic light emitting element configured to generate light during operation; and
an organic light detecting element having an organic light detecting layer;
wherein the organic light emitting element and the organic light detecting element are arranged on the substrate;
wherein part of the light generated by the organic light emitting element during operation enters the substrate, emerges from the substrate and is detected by the organic light detecting element;
wherein the organic light emitting element emits mixed light having at least two color portions and/or colored light during operation; and
wherein the organic light detecting element is designed to detect the light generated by the organic light emitting element during operation in a color-resolved fashion.

17. The organic optoelectronic component according to claim 16, wherein the substrate is embodied in a light-transmissive fashion.

18. An organic optoelectronic component comprising:
a substrate comprising a light-transmissive material;
an organic light emitting element having an organic light emitting layer between two electrodes, the organic light emitting element configured to generate light during operation;
an organic light detecting element having an organic light detecting layer; and
a contact layer electrically contacting at least one of the organic light emitting element and the organic light detecting element;
wherein the organic light emitting element and the organic light detecting element are arranged on the substrate;
wherein part of the light generated by the organic light emitting element during operation enters the substrate, emerges from the substrate and is detected by the organic light detecting element;
wherein the organic light emitting element and the organic light detecting element are both arranged on a main surface of the substrate and are laterally spaced apart from one another;
wherein the contact layer is arranged at least in places at the main surface in a region between the organic light emitting element and the organic light detecting element; and
wherein part of the light generated by the organic light emitting element during operation is reflected at the contact layer in the direction of the main surface of the substrate located opposite the organic light emitting element.

19. The organic optoelectronic component according to claim 18, wherein the substrate is embodied in a light-transmissive fashion.

* * * * *